United States Patent
Bloch et al.

[11] Patent Number: 6,130,574
[45] Date of Patent: Oct. 10, 2000

[54] CIRCUIT CONFIGURATION FOR PRODUCING NEGATIVE VOLTAGES, CHARGE PUMP HAVING AT LEAST TWO CIRCUIT CONFIGURATIONS AND METHOD OF OPERATING A CHARGE PUMP

[75] Inventors: Martin Bloch, Gröbenzell; Christl Lauterbach, Höhenkirchen-Siegertsbrunn, both of Germany

[73] Assignee: Siemens Aktiengesellschaft, Munich, Germany

[21] Appl. No.: 09/360,946

[22] Filed: Jul. 26, 1999

Related U.S. Application Data

[63] Continuation of application No. PCT/DE97/02154, Sep. 23, 1997.

[30] Foreign Application Priority Data

Jan. 24, 1997 [DE] Germany .......................... 197 02 535

[51] Int. Cl.$^7$ .................................................. G05F 3/02
[52] U.S. Cl. .......................................... 327/536; 327/537
[58] Field of Search .................................. 327/536, 537, 327/564, 565, 566

[56] References Cited

U.S. PATENT DOCUMENTS

| | | | |
|---|---|---|---|
| 5,335,200 | 8/1994 | Coffman et al. ......................... | 365/218 |
| 5,422,586 | 6/1995 | Tedrow et al. . | |
| 5,489,870 | 2/1996 | Arakawa ................................. | 327/536 |
| 5,589,793 | 12/1996 | Kassapian ................................ | 327/536 |
| 5,612,921 | 3/1997 | Chang et al. . | |
| 5,625,544 | 4/1997 | Kowhik et al. ........................... | 363/59 |
| 5,767,733 | 6/1998 | Grugett .................................... | 327/534 |
| 5,818,758 | 10/1998 | Wojciechowski .................. | 365/185.18 |
| 5,821,805 | 10/1998 | Jinbo ....................................... | 327/537 |

FOREIGN PATENT DOCUMENTS

| | | |
|---|---|---|
| 0 319 063 A2 | 6/1989 | European Pat. Off. . |
| 0 349 495 A2 | 1/1990 | European Pat. Off. . |
| 0 616 329 A2 | 9/1994 | European Pat. Off. . |
| 0 678 970 A2 | 10/1995 | European Pat. Off. . |
| 196 01 369 C1 | 4/1997 | Germany . |

OTHER PUBLICATIONS

"A 5–V–Only Operation 0.6–$\mu$m Flash EEPROM with Row Decoder Scheme in Triple–Well Structure" (Umezawa et al.), 8107 IEEE Journal of Solid–State Circuits 27, No. 11, Nov. 1992.

*Primary Examiner*—Terry D. Cunningham
*Attorney, Agent, or Firm*—Herbert L. Lerner; Laurence A. Greenberg; Werner H. Stemer

[57] ABSTRACT

A circuit configuration for producing negative voltages includes a first transistor having a first connection connected to an input connection, a second connection connected to an output connection of the circuit configuration and a gate connection connected through a first capacitor to a first clock signal connection. A second transistor has a first connection connected to the gate connection of the first transistor, a second connection connected to the second connection of the first transistor and a gate connection connected to the first connection of the first transistor. A second capacitor has a first connection connected to the second connection of the first transistor and a second connection connected to a second clock signal connection. The transistors are MOS transistors produced in a triple well. A third transistor has a first connection connected to the second connection of the first transistor, a second connection connected to the well(s) containing the transistors and a gate connection connected to the first connection of the first transistor. A charge pump having at least two of the circuit configurations and a method of operating the charge pump are also provided.

4 Claims, 6 Drawing Sheets

CIRCUIT CONFIGURATION FOR PRODUCING NEGATIVE VOLTAGES, CHARGE PUMP HAVING AT LEAST TWO CIRCUIT CONFIGURATIONS AND METHOD OF OPERATING A CHARGE PUMP

CROSS-REFERENCE TO RELATED APPLICATION

This application is a continuation of copending International Application No. PCT/DE97/02154, filed Sep. 23, 1997, which designated the United States.

BACKGROUND OF THE INVENTION

Field of the Invention

The invention relates to a circuit configuration for producing negative voltages, including a first transistor having a first connection connected to an input connection, a second connection connected to an output connection of the circuit configuration and a gate connection connected through a first capacitor to a first clock signal connection, a second transistor having a first connection connected to the gate connection of the first transistor, a second connection connected to the second connection of the first transistor and a gate connection connected to the first connection of the first transistor, and a second capacitor having a first connection connected to the second connection of the first transistor and a second connection connected to a second clock signal connection, the transistors being MOS transistors produced in at least one triple well.

Such a circuit configuration is known from German Patent DE 196 01 369 C1. In that publication, the transistors are implemented as n-channel transistors in a p-well. The p-well is in turn produced in a deep, insulating n-well which is disposed in a p-substrate.

In principle, the circuit configuration can also be implemented in that way by using p-MOS transistors in an n-substrate.

The deep n-well is connected to ground potential, like the p-substrate. If the p-well is then given a more negative bias than the most negative voltage either at the drain connection or at the source connection of the first transistor, then no leakage current can flow when the circuit is in the steady state, not even through the parasitic well-substrate bipolar transistors. Thus, for example, an npn transistor is formed by the n$^+$-drain region which acts as an emitter of the NMOS transistor, the p-well which forms the base, and the n-well which forms the collector. When the well potential is more positive than the drain region of the NMOS transistor, the parasitic npn transistor will be switched on and will impair the efficiency of the charge pump.

The principle of the known circuit configuration operating as a charge pump is based on the fact that charges from a capacitor which is connected to the drain connection of the first transistor are "pumped" to a capacitor which is connected to the source connection of that transistor, by a voltage being alternately applied to the respective other capacitor connections. When a number N of circuit configurations of that type are connected in series, and the input of the first circuit configuration and the other connection of the capacitor connected to the output are connected to the ground connection, an output voltage of $|(N-1)U_O|$ can theoretically be obtained, where $U_O$ is the voltage at the clock signal connections.

The charging process is a dynamic process in which the voltages at the source and drain connections of the first transistors of the circuit configuration are constantly changing, with the result that the parasitic bipolar transistor is regularly switched on.

In order to solve that problem, German Patent DE 196 01 369 C1 proposes connecting the wells in which the transistors are disposed to the respective source connections of the transistors since, in the steady state, the most negative voltage in each case is present there. However, that assumption is in fact only true for the steady final state of the charge pump circuit, which will never actually occur in practice since the charge pump is continually discharged by a load.

As soon as the known circuit is switched on the well will be at a potential which corresponds to the clock signal voltage and is higher than the drain connection, and the bipolar transistor will therefore switch on. The result will be a massive efficiency loss since the charge pump firstly does not achieve the theoretically possible maximum output voltage and secondly adopts the output voltage to be reached much more slowly.

SUMMARY OF THE INVENTION

It is accordingly an object of the invention to provide a circuit configuration for producing negative voltages, a charge pump having at least two circuit configurations and a method of operating a charge pump, which overcome the hereinafore-mentioned disadvantages of the heretofore-known devices and methods of this general type and in which the circuit configuration has a high level of efficiency.

With the foregoing and other objects in view there is provided, in accordance with the invention, a circuit configuration for producing negative voltages, comprising at least one triple well; an input connection and an output connection of the circuit configuration; first and second clock signal connections; a first MOS transistor produced in the at least one triple well and having a first connection connected to the input connection, a second connection connected to the output connection, and a gate connection; a first capacitor connected between the gate connection of the first transistor and the first clock signal connection; a second MOS transistor produced in the at least one triple well and having a first connection connected to the gate connection of the first transistor, a second connection connected to the second connection of the first transistor, and a gate connection connected to the first connection of the first transistor; a second capacitor having a first connection connected to the second connection of the first transistor and a second connection connected to the second clock signal connection; and a third transistor having a first connection connected to the second connection of the first transistor, a second connection connected to the well containing the transistors, and a gate connection connected to the first connection of the first transistor.

In the circuit configuration according to the invention and the charge pump formed from a plurality of circuit configurations of this type, a third transistor is provided which connects the well to the source connection of the first (charging) transistor only when the potential at the source connection is more negative than the potential at the drain connection of the first transistor. In this case the well capacitor which is produced by the pn depletion layer between the two wells is charged up to the source potential and keeps the well at this potential for a sufficient time, even when the third transistor is switched off again, because the drain connection potential of the first transistor is more negative than the source connection potential of this transistor.

In accordance with another feature of the invention, there is provided a fourth transistor which connects the well to the drain connection of the first transistor when the drain connection potential is more negative than the source connection potential of the first transistor. In this embodiment, the well capacitor is therefore always charged to the more negative potential, with the result that no steady states can occur in which the well is more positive than one of the connections of the first transistor and consequently a parasitic bipolar transistor is switched on.

In accordance with a further feature of the invention, there is provided a capacitor disposed between the drain connection of the first transistor and the well. Like the well capacitor, this capacitor is charged up to the source connection potential during the switched-on phase of the third capacitor and is connected in series with the well capacitor in the off phase of the third transistor. As a result, the voltage across the well capacitor is shifted to more negative values when the drain connection potential drops. The well is therefore more negative than would be possible purely by charging through the source connection of the first transistor.

With the objects of the invention in view, there is also provided a charge pump for generating negative voltages, comprising at least two of the circuit configurations connected in series, the circuit configurations including a first circuit configuration, and the input connection of the first circuit configuration connected to ground potential.

The charge pump is created by connecting a plurality of circuit configurations according to the invention in series, so that voltages of −12 V or even −20 V can be produced. Such charge pumps are necessary for programming and/or erasing non-volatile memories, in particular flash-EPROM memories, using chip supply voltages of only 2.5 V.

With the objects of the invention in view, there is additionally provided a method of operating the charge pump, which comprises shifting clock signals at the clock signal connections of a respective one of the circuit configurations by half a clock period of clock signals of a preceding one of the circuit configurations.

In a charge pump of this type a first and a second clock signal are applied to odd-numbered circuit configurations, and third and fourth clock signals are applied to even-numbered circuit configurations. The latter clock signals have the same waveform as the first and second clock signals, but are shifted by half a period.

In accordance with a concomitant mode of the invention, the clock signals at the second clock signal connection of the circuit configurations have a duty ratio of more than 0.5, so that the second and fourth clock signals overlap. As a result of this, the first transistors are precharged, which leads to an increase in efficiency.

Other features which are considered as characteristic for the invention are set forth in the appended claims.

Although the invention is illustrated and described herein as embodied in a circuit configuration for producing negative voltages, a charge pump having at least two circuit configurations and a method of operating a charge pump, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
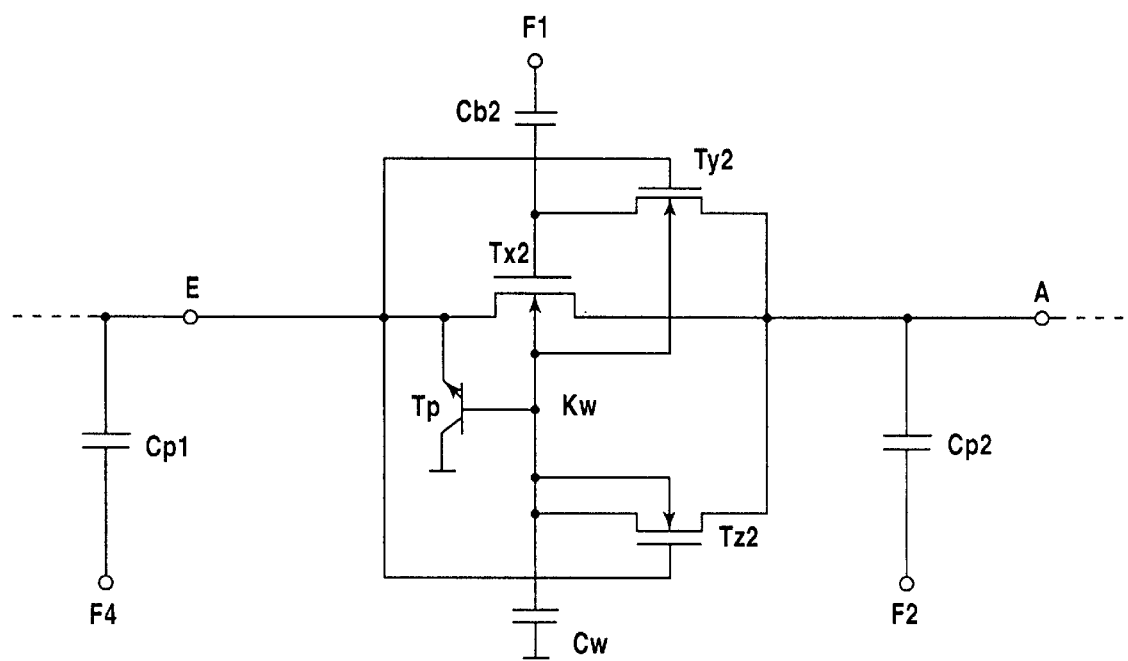
FIG. 1 is a detailed schematic diagram of a circuit configuration according to the invention.

Referring now to the figures of the drawings in detail and first, particularly, to FIG. 1 thereof, there is seen a circuit configuration according to the invention, that can be regarded as one stage of a multi-stage charge pump for producing a negative voltage. In the circuit configuration, a first NMOS transistor Tx2 is connected between an input connection E and an output connection A.

Figure 2:
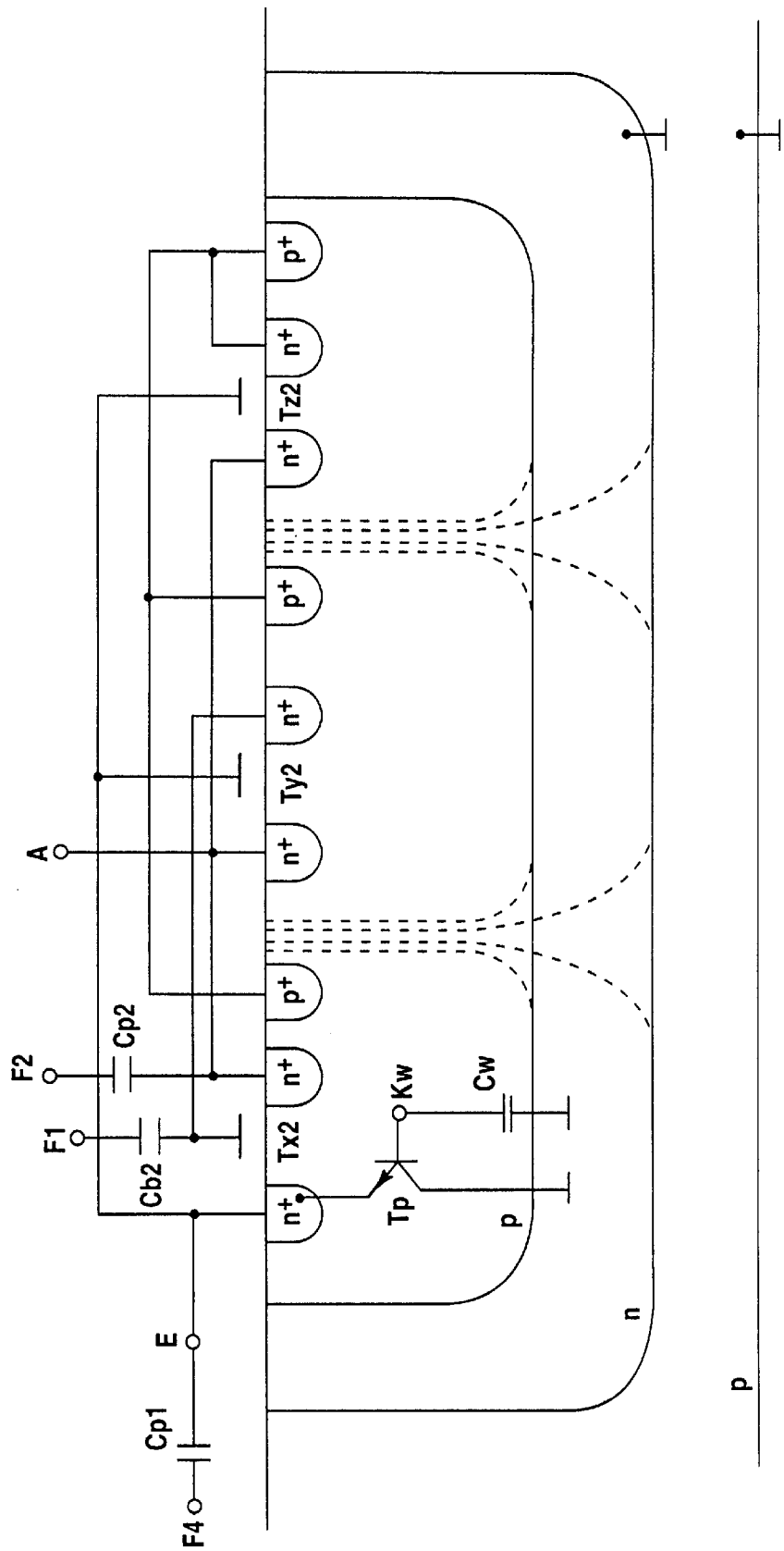
FIG. 2 is a fragmentary, diagrammatic, cross-sectional view illustrating the way in which a circuit configuration of this type is produced in a p-substrate using triple-well technology.

As is shown in FIG. 2, the first transistor Tx2 is produced in a p-well which is in turn disposed in a deep, insulating n-well. This deep n-well is produced in a p-substrate. Both the n-well and the p-substrate are connected to ground.

A gate connection of the first transistor Tx2 is connected through a first capacitor Cb2 to a first clock signal connection, to which a first clock signal F1 can be applied. A source connection of the first transistor Tx2 is connected to a first connection of a second capacitor Cp2. The second capacitor Cp2 has a second connection that is connected to a second clock signal connection, to which a second clock signal F2 can be applied.

Figure 3:
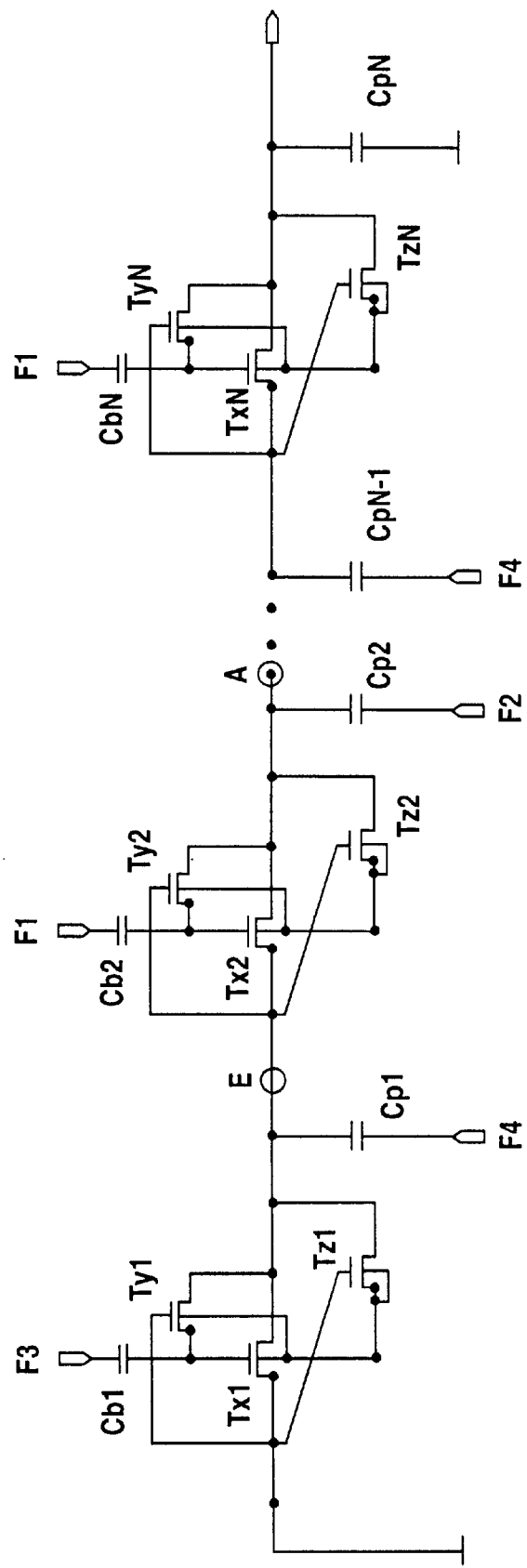
FIG. 3 is a circuit diagram of a first embodiment of a charge pump.

The input connection E of the circuit configuration can be connected to an output connection of another, identical circuit configuration, as is shown in detail in FIG. 3 and indicated in FIG. 1 by a second capacitor Cp1 of the other circuit configuration. FIG. 3 also shows third and fourth clock signals F3 and F4 which are respectively applied to third and fourth clock signal connections.

Figure 6:
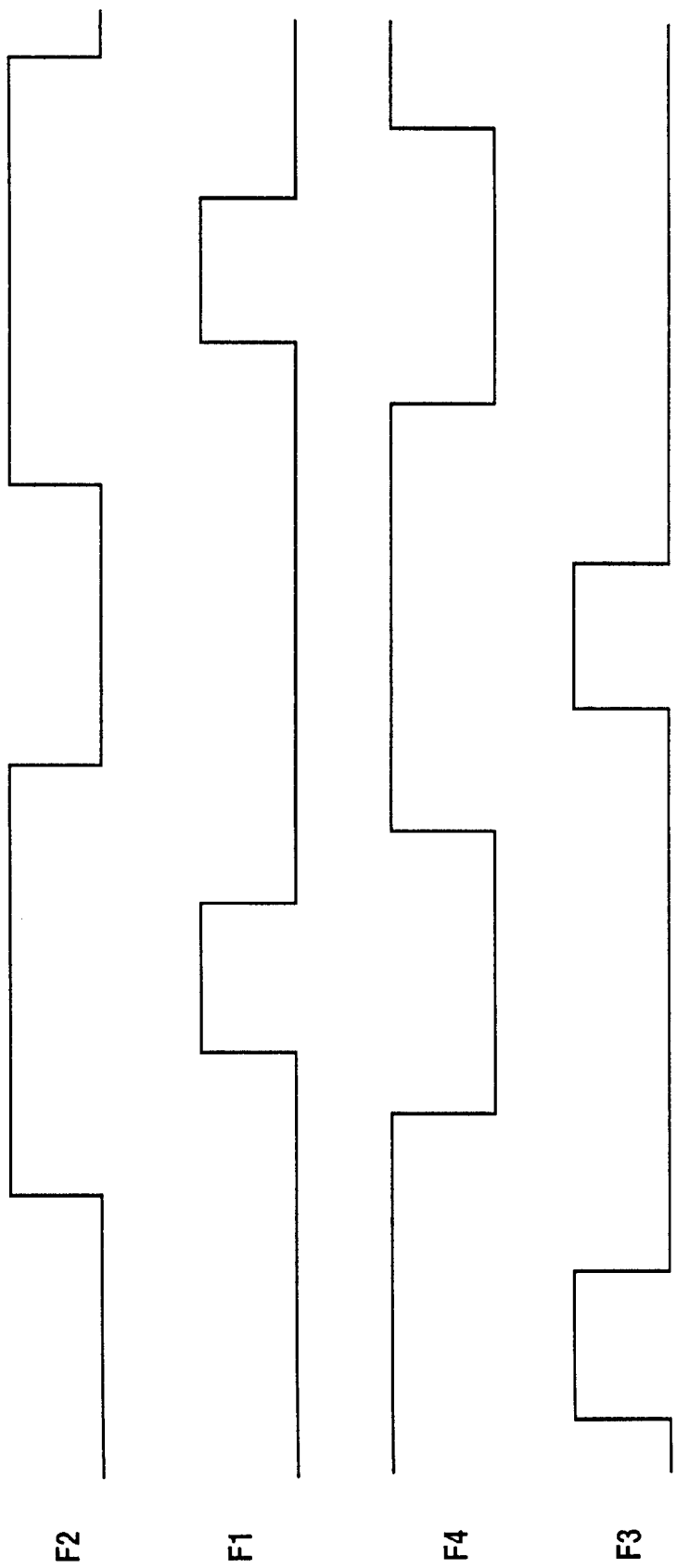
FIG. 6 is a graph showing a time profile of clock signals.

As is shown in FIG. 6, the second and fourth clock signals F2 and F4 have the same time profile, but are shifted by half a clock period with respect to one another. As a result of this alternate application of a positive voltage to the second and fourth clock signal connections, charges from the second capacitor Cp1 of the further or preceding circuit configuration in a chain of circuit configurations according to FIG. 3 are pumped through the first transistor Tx2 to the second capacitor Cp2 of the following circuit configuration shown in FIG. 1. During the pumping phase, the first clock signal F1, having a time profile which is also shown in FIG. 6, brings the gate connection of this transistor to a potential which is positive with respect to the source connection of the first transistor Tx2, with the result that the latter is switched on. Advantageously, the clock signals F2 and F4 overlap somewhat, so that the first transistor is precharged before it is switched on by the first clock signal F1.

As a result of charges being pumped to the second capacitor Cp2, the latter is charged up and the output connection A as well as the source connection of the first transistor Tx2 that is connected to the output connection A become negative after the second clock signal F2 has been switched off. The source connection would therefore be more negative than the gate connection of the first transistor Tx2, with the result that the latter would not be switched off and the second capacitor Cp2 would be able to discharge again. For this reason, a second transistor Ty2 is connected between the gate connection and the source connection of the first transistor Tx2. A gate connection of this second transistor Ty2 is connected to a drain connection of the first transistor Tx2. This second transistor Ty2 also raises the gate connection of the first transistor Tx2 to the potential of the source connection of the first transistor Tx2, with the result that the latter is switched off.

The first capacitor Cb2 is provided to prevent the second capacitor Cp2 from discharging through the second transistor Ty2 and the first clock signal connection.

According to the invention, a third NMOS transistor Tz2 is connected between the source connection of the first transistor Tx2 and a connection of a well Kw in which the transistor Tz2 is produced. A gate connection of this NMOS transistor Tz2 is likewise connected to the drain connection of the first transistor Tx2.

As can be seen from FIG. 2, the second and the third transistors Ty2 and Tz2 are also disposed in the p-well in which the first transistor Tx2 is produced. As is indicated by dashed lines, they can also be produced in their own wells. However, the wells are advantageously connected to one another by lines.

Through the use of the third transistor Tz2, the well Kw which is represented in FIG. 1 by a node is kept at a negative potential. As a result, a pn junction between the p-well and the n-well is polarized in the reverse direction and no leakage current can flow. In addition, a well-well junction capacitor Cw is charged through the third transistor Tz2, with the result that the p-well is kept at the negative potential even when the third transistor Tz2 is switched off.

In addition, FIG. 2 shows a parasitic npn transistor Tp which is formed by the $n^+$-drain region of the first transistor Tx2, the p-well and the n-well. This parasitic transistor Tp is also indicated in FIG. 1. It can clearly be seen that this transistor would be switched on and would lead to a leakage current if the p-well were more positive than the drain connection of the first transistor Tx2. However, this is effectively prevented by the third transistor according to the invention.

As was already mentioned, a plurality of circuit configurations of this type according to the invention can be connected in series in order to produce not simply a negative voltage, but a negative voltage which is high in comparison with the supply voltage, as is necessary, for example, for programming and erasing flash-EPROM memories.

In FIG. 3, a number N of circuit configurations of this type according to FIG. 1 are connected in series. The first transistors are designated by reference symbols Tx1 to TxN. The other circuit components are numbered in an equivalent manner. The second capacitor CpN of the $n^{th}$ circuit configuration does not have a clock signal voltage applied to it since it is intended to tap off the negative high voltage at this point. A voltage of $(N-1) \cdot U_O$ can be produced by using a charge pump of this type, which is formed of N pump stages as is shown in FIG. 3, if the input of the first pump stage is connected to ground and $U_O$ is the level of the clock signals. The clock signals F1–F4 in this case have the time profiles shown in FIG. 6. The clock signals F3 and F4 have the same time profile as the clock signals F1 and F2, but are shifted by half a clock period.

The clock signals F3 and P4 are applied to the odd-numbered pump stages of the charge pump according to FIG. 3 and the clock signals F1 and F2 are applied to the even-numbered pump stages.

Figure 4:
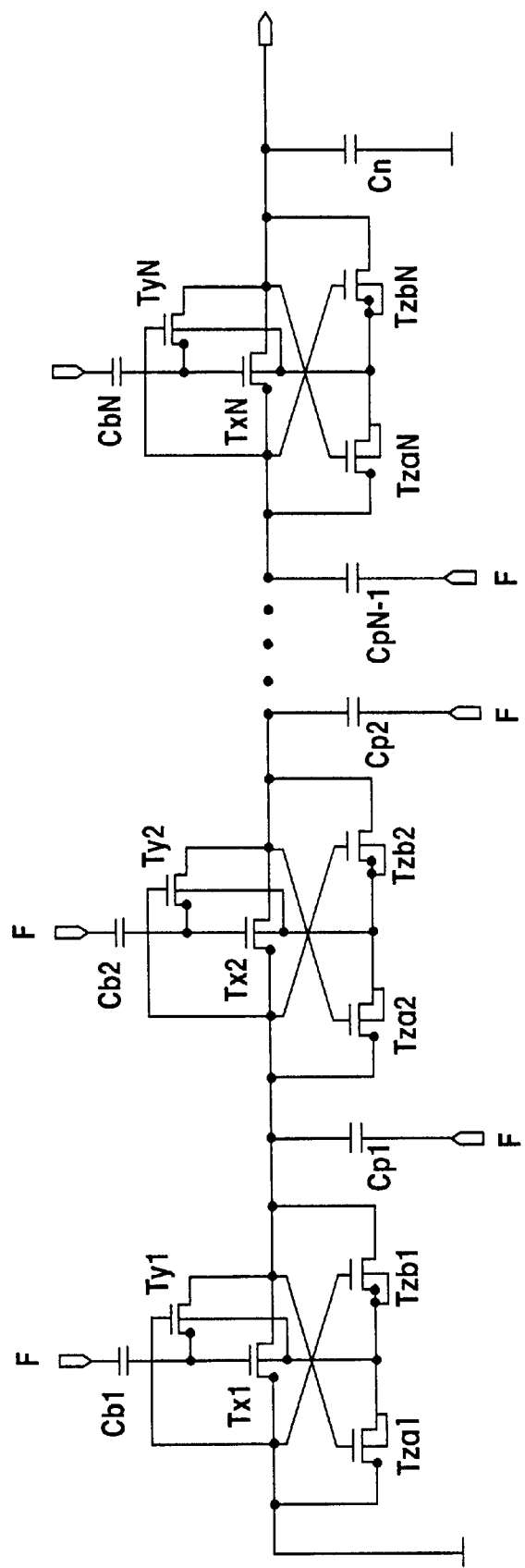
FIG. 4 is a circuit diagram of a second embodiment of a charge pump.

FIG. 4 shows another embodiment of the invention. In the circuit configurations of the charge pump shown therein, fourth NMOS transistors Tza1–TzaN are disposed between the drain connections of the first transistors Tx1–TxN and the wells. Gate connections of the fourth transistors Tza1–TzaN are respectively connected to the source connections of the first transistors Tx1–TxN. The third transistors are designated therein by reference symbols Tzb1–TzbN.

The fourth transistors Tza1–TzaN ensure that, even if there is a lower potential at the drain connections of the first transistors Tx1–TxN than at the source connections of the latter, this lowest potential is switched through to the wells and the wells are therefore always at the lowest of the two potentials.

Figure 5:
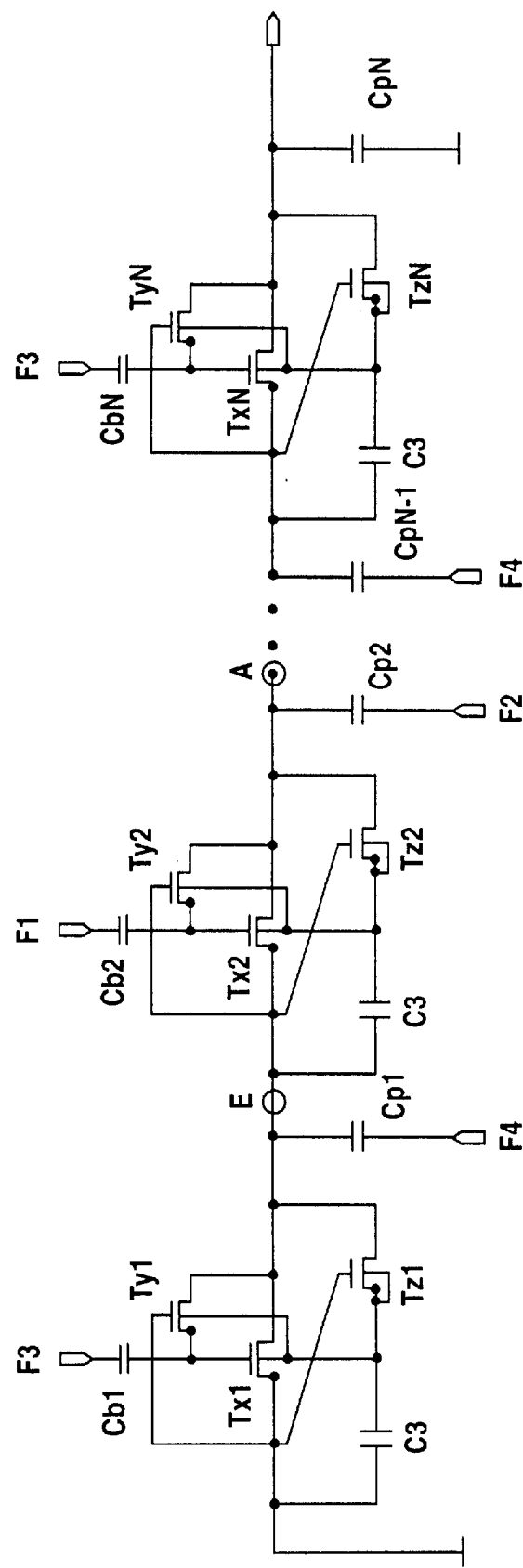
FIG. 5 is a circuit diagram of a third embodiment of a charge pump.

FIG. 5 shows an advantageous development of the circuit configuration according to FIG. 1 and of the charge pump according to FIG. 3, in which a third capacitor C3, instead of the fourth transistors Tza1–TzaN, is connected between the drain connections of the first transistors Tx1–TxN and the wells Kw. The third capacitors C3, together with the well-well capacitors Cw (which are not shown explicitly in FIG. 5), lead to a further drop in the well potential.

The charge pumps according to the invention which are shown in FIGS. 3 to 5 are characterized by a high level of efficiency, so that output voltages of −20 V can be achieved even with a small supply voltage of approximately 2.5 V.

We claim:

1. A circuit configuration for producing negative voltages, comprising;

an input connection and an output connection;

first and second clock signal connections;

a first MOS transistor having a first connection connected to said input connection, a second connection connected to said output connection, and a gate connection;

a first capacitor connected between said gate connection of said first transistor and said first clock signal connection;

a second MOS transistor having a first connection connected to said gate connection of said first transistor, a second connection connected to said second connection of said first transistor, and a gate connection connected to said first connection of said first transistor;

a second capacitor having a first connection connected to said second connection of said first transistor and a second connection connected to said second clock signal connection;

a third transistor having a first connection connected to said second connection of said first transistor, a second connection connected to backgates of said first and second transistors, and a gate connection connected to said first connection of said first transistor;

a third capacitor having a first connection connected to said first connection of said first transistor and a second connection connected to backgates of said first and second transistors; and said first, second and third MOS transistors produced in a triple well structure.

2. A charge pump for generating negative voltages, comprising:

at least two circuit configurations connected in series, said circuit configurations including a first circuit configuration, and each of said circuit configurations including:

an input connection and an output connection;

first and second clock signal connections;

a first MOS transistor having a first connection connected to said input connection, a second connection connected to said output connection, and a gate connection;

a first capacitor connected between said gate connection of said first transistor and said first clock signal connection;

a second MOS transistor having a first connection connected to said gate connection of said first transistor, a second connection connected to said second connection of said first transistor, and a gate connection connected to said first connection of said first transistor;

a second capacitor having a first connection connected to said second connection of said first transistor and a second connection connected to said second clock signal connection;

a third transistor having a first connection connected to said second connection of said first transistor, a second connection connected to backgates of said first and second transistors, and a gate connection connected to said first connection of said first transistor;

a third capacitor having a first connection connected to said first connection of said first transistor and a second connection connected to backgates of said first and second transistors; and said first, second and third MOS transistors produced in a triple well structure; and said input connection of said first circuit configuration connected to ground potential.

3. A charge pump according to claim 2, wherein the circuit is operated by shifting clock signals at said clock signal connections of a respective one of said circuit configurations by half a clock period of clock signals of a preceding one of said circuit configurations.

4. A charge pump according to claim 3, wherein a duty ratio of at least clock signals at said second clock signal connections is greater than 0.5.

* * * * *